(12) United States Patent
Cha et al.

(10) Patent No.: US 9,243,310 B2
(45) Date of Patent: Jan. 26, 2016

(54) COATING MATERIAL FOR ALUMINUM DIE CASTING AND METHOD FOR COATING THE SAME

(71) Applicant: Hyundai Motor Company, Seoul (KR)

(72) Inventors: Sung-Chul Cha, Seoul (KR); Seong-Jin Kim, Gyeonggi-Do (KR); Seong-Hoon Lee, Ulsan (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/142,863

(22) Filed: Dec. 29, 2013

(65) Prior Publication Data

US 2015/0072123 A1    Mar. 12, 2015

(30) Foreign Application Priority Data

Sep. 12, 2013 (KR) .......................... 10-2013-0109477

(51) Int. Cl.
  *C23C 14/06* (2006.01)
  *C22C 14/00* (2006.01)
  *C23C 14/34* (2006.01)
  *C23C 28/04* (2006.01)
  *C23C 30/00* (2006.01)

(52) U.S. Cl.
  CPC .............. *C22C 14/00* (2013.01); *C23C 14/0664* (2013.01); *C23C 14/3464* (2013.01); *C23C 28/04* (2013.01); *C23C 30/00* (2013.01); *Y10T 428/24975* (2015.01); *Y10T 428/265* (2015.01)

(58) Field of Classification Search
  USPC ........................... 428/216, 336, 697, 698, 699
  See application file for complete search history.

(56) References Cited

U.S. PATENT DOCUMENTS

| | | | |
|---|---|---|---|
| 6,296,928 B1 * | 10/2001 | Yamada et al. | 428/336 |
| 7,056,602 B2 * | 6/2006 | Horling et al. | 428/698 |
| 7,083,868 B2 * | 8/2006 | Horling et al. | 428/697 |
| 7,211,138 B2 * | 5/2007 | Yamamoto et al. | 428/697 |
| 7,354,640 B2 * | 4/2008 | Kubota | 428/699 |
| 7,744,056 B2 * | 6/2010 | Inoue et al. | 428/698 |
| 2008/0166588 A1 | 7/2008 | Astrand | |
| 2012/0315453 A1* | 12/2012 | Cha et al. | 428/216 |

FOREIGN PATENT DOCUMENTS

| | | |
|---|---|---|
| JP | 6-322517 A | 11/1994 |
| JP | 7-47814 B2 | 2/1995 |
| JP | 2008007835 A | 1/2008 |
| JP | 2009263717 A | 11/2009 |
| KR | 10-2014-0019947 A | 2/2014 |

* cited by examiner

*Primary Examiner* — A. A. Turner
(74) *Attorney, Agent, or Firm* — Mintz Levin Cohn Ferris Glovsky and Popeo, P.C.; Peter F. Corless

(57) ABSTRACT

Disclosed is a coating material for aluminum die casting and a method for coating the same, the coating material including: a CrN adhesion layer formed on a surface of a base material; a TrAlN/CrN support layer formed on a surface of the CrN adhesion layer; and a TiAlN(CrSi)VCN functional layer formed on a surface of the TiAlN/CrN support layer. The present coating material solves the hot stamping and sticking problem of a conventional aluminum die casting mold and the like, enhances thermal resistance, and further has enhanced thermal resistance, high-temperature wear resistance, sticking resistance and thermal impact resistance compared to that of a conventional coating material.

3 Claims, 10 Drawing Sheets

PRIOR ART

US 9,243,310 B2

COATING MATERIAL FOR ALUMINUM DIE CASTING AND METHOD FOR COATING THE SAME

CROSS-REFERENCE TO RELATED APPLICATIONS

This application claims priority under 35 U.S.C. §119 to Korean Patent Application No. 10-2013-00109477, filed on Sep. 12, 2013, in the Korean Intellectual Property Office, the disclosure of which is incorporated herein by reference in its entirety.

BACKGROUND OF THE INVENTION

1. Field of the Invention

The present invention relates to a coating material which is applicable for coating on a surface of an aluminum die casting mold, parts of a high temperature sliding member and the like, which are exposed to a high temperature. More particularly, the present invention relates to a coating material including a CrN adhesion layer, a TiAlN/CrN support layer, a TiAl(CrSi) VCN functional layer and the like, and a method for coating the same.

2. Description of the Related Art

As manufacturing processes are becoming automatized, scaled up and sped up in conjunction with industrial development, the con under which various metal materials, such as molds and mechanical structures, used are becoming increasingly rigorous. In particular, high-level physical properties are required for an aluminum die casting mold due to the environment in which such molds are continuously subjected to high loads and high impact. Generally, the lifespan of the mold is determined by the material forming the mold, the mold design, working conditions under which the mold is subjected to, heat treatment and surface treatment of a mold and the like. Further, there is a problem in that the lifespan of a mold is drastically reduced as a result of heat checking caused by thermal impact and generation of sticking and abrasion caused by molten aluminum, a thermal softening phenomenon caused by working at a high temperature, and the like.

Further, the automotive industry is developing various environmentally friendly vehicles with a goal of reducing the amount of carbon dioxide emission to 50 g/km by the year 2020, which is a level of about 35% to 50% of the current level. In order to achieve this goal, efforts to increase combustion efficiency of an engine and reduce NOx and the like have been made.

In order to increase the combustion efficiency and reduce the emission of NOx and the like, an exhaust gas recirculation (EGR) is mounted. The EGR is an apparatus which recirculates a portion of an inert exhaust gas into an intake system, allows the recirculated exhaust gas to be mixed with a mixed gas introduced into the engine, and decreases the maximum temperature during combustion to produce less NOx.

Generally, the EGR includes a flat valve, a shaft, bushing, a washer, a housing and the like, and an actuator outside the housing adjusts the opening and closing of the flat valve. In this case, the flat valve and the bushing or the washer and the bushing slide off at high temperatures.

As a result, it is difficult to open and close the flat valve due to high temperature sticking and high temperature abrasion of the washer or the flat valve and the bushing, and quality problems such as noise generation, output generation and the like occur.

In order to solve the above problems, CrN has been recently applied as a metal coating material. However, since a reduction in hardness occurs due to insufficient thermal resistance at 500° C. or more and a sticking phenomenon occurs during friction and abrasion, there is a problem in that abrasion is accelerated.

In particular, a high level of physical properties are generally required for an aluminum die casting mold due to ultra-high pressure and high cyclization, and therefore TiAlN or AlCrN and the like have been used as a coating material in the related art.

However, there are problems in that the TiAlN coating material has inadequate thermal resistance for use as a coating material of an aluminum die casting mold, which is exposed to high-temperature conditions of up to 750° C., and further has insufficient thermal stability which results in deterioration in physical properties and the like, when exposed to high-temperature environments. In addition, while the AlCrN coating has relatively excellent thermal resistance compared to the TiAlN coating, it has a very low sticking resistance in that a molten alloy of aluminum and the like easily adheres to the surface of a mold coated with TiAlN. This results in problems, such as a decrease in the lifespan of the mold and a deterioration in the quality of a casting product produced therefrom.

SUMMARY OF THE INVENTION

The present invention has been made in an effort to enhance thermal resistance, wear resistance, sticking resistance, low friction, toughness and the like of a coating material. In particular, the present invention relates to a coating material that provides such properties by including a TiAl (CrSi)VCN functional layer, and a method for producing the same.

According to one aspect, the present invention relates to a coating material for aluminum die casting, including a CrN adhesion layer on a surface of a base material of the mold (e.g., the surface of the mold); a TiAlN/CrN support layer on a surface of the CrN adhesion layer; and a TiAl(CrSi)VCN functional layer on a surface of the TiAlN/CrN support layer.

According to various embodiments, a thickness of the TiAl (CrSi)VCN functional layer is preferably about 0.5 μm to about 10 μm.

Furthermore, it is preferred that a thickness of the TiAlN/ CrN support layer is about 0.5 μm to about 10 μm and a thickness of the CrN adhesion layer is about 0.1 μm to about 10 μm.

According to various embodiments, a VC content of the TiAl(CrSi)VCN functional layer is preferably about 10 atom % to about 50 atom.

According to various embodiments, a CrSi content of the TiAl(CrSi)VCN functional layer is preferably about 5 atom % to about 40 atom %.

According to another aspect, the present invention provides a method for coating a coating material on a mold for aluminum die casting, the method including: a first step of forming a nitrogen atmosphere within a chamber in which a mold is disposed by introducing a nitrogen gas through a gas introducing unit, and then depositing a CrN adhesion layer on a surface of a base material of the mold by using a Cr/Si target; a second step of depositing a TiAlN/CrN support layer on a surface of the CrN adhesion layer by using a TiAl target and a Cr/Si target; a third step of forming an acetylene gas ($C_2H_2$) atmosphere by introducing an acetylene gas ($C_2H_2$) through the gas introducing unit, and then depositing a TiAlCrSiVCN functional layer on a surface of the TiAlN/CrN support layer by using a TiAl target, a Cr/Si target and a V target; and the like thereby forming the coating.

According to another aspect, the present invention provides a method for coating a coating material on a mold for aluminum die casting, the method including: a first step of forming a nitrogen atmosphere within a chamber in which the mold is disposed by introducing a nitrogen gas through a gas introducing unit, and then depositing a CrN adhesion layer on a surface of a base material of the mold by using a Cr/Si target; a second step of depositing a TiAlN/CrN support layer on a surface of the CrN adhesion layer by using a TiAl target and a Cr/Si target; a third step of forming an acetylene gas ($C_2H_2$) atmosphere by introducing an acetylene gas ($C_2H_2$) through the gas introducing unit, and then depositing a TiAlVCN functional layer on a surface of the TiAlN/CrN support layer by using a TiAl target and a V target; and the like, thereby forming the coating.

According to various embodiments, a thickness of the TiAlCrSiVCN functional layer in the third step is preferably about 0.5 μm about 10 μm.

According to various embodiments, a VC content of the TiAlCrSiVCN functional layer in the third step is preferably about 10 atom % to about 50 atom %.

According to various embodiments, a CrSi content of the TiAlCrSiVCN functional layer in the third step is preferably about 5 atom % to about 40 atom %.

According to various embodiments, a thickness of the TiAlVCN functional layer in the third step is preferably about 0.5 μm to about 10 μm.

According to various embodiments, a VC content of the TiAlVCN functional layer in the third step is preferably about 10 atom % to about 50 atom %.

It is preferred that in the second step and the first step, a thickness of the TiAlN/CrN support layer is about 0.5 μm to about 10 μm and a thickness of the CrN adhesion layer is about 0.1 μm to about 10 μm.

According to various embodiments, it is preferred that the TiAlN/CrN support layer in the second step is deposited at a ratio of Ti:Al:Cr of about 1:1:1.

As described above, the present invention provides a coating material wherein problems of hot stamping and sticking of an aluminum die casting mold and the like are solved. In particular, the present coating material provides such benefits through the use of a multilayered coating which includes a TiAl(CrSi)VCN functional layer on the surface of a TiAlN/CrN support layer. AS such, thermal resistance of the mold is enhanced, and the lifespan of the mold is enhanced by at least about 4 times that of conventional coating materials.

In addition, the present coating makes it possible to secure the quality of hi temperature sliding parts, such as an engine exhaust system, and economic efficiency is enhanced due an increased lifespan of the product resulting from the improvements in quality of the coated mold.

Furthermore, there is an advantage in that thermal resistance, high-temperature wear resistance, sticking resistance and thermal impact resistance are enhanced by at least about 20 times, at least about 10 times, about 4 times to about 5 times, and at least about 2 times, respectively, compared to those provided with conventional coating materials.

Other features and aspects of the present invention will be apparent from the following detailed description, drawings and claims.

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not limitative of the present invention, and wherein.

Figure 1:
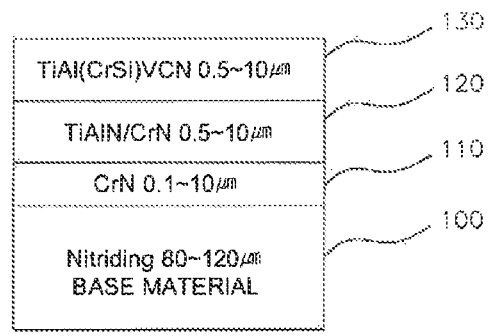
FIG. 1 is a view illustrating the structure of a coating material according to an embodiment of the present invention.

It should be understood that the appended drawings are not necessarily to scale, presenting a somewhat simplified representation of various preferred features illustrative of the basic principles of the invention.

In the figures, reference numbers refer to the same or equivalent parts of the present invention throughout the several figures of the drawing.

DETAILED DESCRIPTION OF THE EMBODIMENTS

Terms or words used in the present specification and claims should not be interpreted as being limited to typical or dictionary meanings, but should be interpreted as having meanings and concepts, which comply with the technical spirit of the present invention, based on the principle that an inventor can appropriately define the concept of the term to describe his/her own invention in the best manner.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and elect powered vehicles.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about".

The present invention relates to a coating material for an aluminum die casting mold and a method for coating the same. Hereinafter, the present invention will be described in detail with reference to drawings and Tables.

In one aspect, the present invention relates to a coating material for an aluminum die casting mold.

In general, since an aluminum die casting mold is used under rigorous conditions due to ultrahigh pressure and high cyclization that the mold is subjected to, high-level physical properties sufficient to withstand the conditions are required. In order to provide the requisite properties, the present invention provides a multi-layered coating material, in which a TiAl(CrSi)VCN coating material is included, and a method for coating the same. The coating material of the present invention may be applied to the surface of the aluminum die casting mold or the surface of a casting formed by the mold subjected to high temperature conditions. The coating material of the present invention is excellent in thermal resistance, wear resistance, and sticking resistance, and provides low friction properties.

As referred to herein, the TiAl(CrSi)VCN is defined as TiAlCrSiVCN or TiAlVCN.

1. Structure of Coating Material

FIG. 1 is a view illustrating the structure of a coating material according to an embodiment of the present invention. As illustrated in FIG. 1, the coating material includes a CrN adhesion layer 110 which is coated on the surface of a base material 100, a TiAlN/CrN support layer 120 which is formed on the surface of the CrN adhesion layer 110, a TiAl(CrSi)VCN functional layer 130 which is formed on the surface of the TiAlN/CrN support layer 120. According to various embodiments, the TiAlN/CrN support layer 120 supports the TiAl(CrSi)VCN functional layer 130 and may provide desired physical properties that are not provided by the other layers. According various embodiments, the thus formed multi-layered coating exhibits excellent thermal resistance, wear resistance, sticking resistance, low friction and toughness characteristics.

According to various embodiments, the base material 100 may be the surface of the mold itself, or it may be in the form of a nitride layer that is applied by a nitriding treatment or the like. Such a nitride layer may provide an increased hardness to the surface of the mold and enhance the hardness, if necessary. According to various embodiments, the thickness of such a of nitride layer is preferably about 80 μm to about 120 μm.

1.1. CrN Adhesion Layer

The CrN adhesion layer has excellent mechanical properties such as wear resistance and lubrication properties of a coating material, and excellent chemical stability such as corrosion resistance. The CrN adhesion layer serves to minimize the residual stress of the coating material and enhance toughness, fatigue resistance, impact resistance, and the like.

According to preferred embodiments, the thickness of the CrN adhesion layer is about 0.1 μm to 10 μm. If the thickness of the CrN adhesion layer is less than about 0.1 μm, toughness, fatigue resistance, impact resistance and the like may not be sufficiently enhanced. On the other hand, if the thickness of the CrN adhesion layer is more than about 10 μm, the peeling-off phenomenon of the coating material may be caused by an excessively thick CrN adhesion layer.

1.2. TiAlN/CrN Support Layer

The TiAlN/CrN support layer serves to enhance thermal resistance, oxidation resistance, wear resistance, toughness and the like of the coating material, and to further support and attach a functional layer through its excellent adhesion property. It is preferred that the TiAlN and the CrN have an alternating lamination structure in which the TiAlN and the CrN are alternately laminated. While TiAlN has excellent adhesion property, wear resistance and the like, CrN has excellent wear resistance due to its high hardness.

According to various embodiments, the thickness of the TiAlN/CrN support layer is preferably about 0.5 μm to 10 μm. If the thickness of the TiAlN/CrN support layer is less than about 0.5 μm, the role of the support layer may not be sufficiently exhibited. On the other hand, if the thickness of the TiAlN/CrN support layer is more than about 10 μm, the role thereof is saturated and the economic efficiency thereof may deteriorate (i.e., further increase in the amount of the TiAlN/CrN through an increased thickness in the layer does not provide further benefits or adequate benefits to justify the additional cost associated therewith).

1.3. TiAl(CrSi)VCN Functional Layer

The TiAl(CrSi)VCN functional layer serves to enhance oxidation resistance, thermal resistance, wear resistance, sticking resistance, low friction, toughness and the like of the coating material. According to embodiments of the present invention, the (CrSi)V of the functional layer enhances sticking resistance, low friction, toughness and the like of the coating material. Further, the V reduces friction of the coating material by forming $V_2O_2$, which is a low friction oxide, at a temperature of about 500° C. or more, and allows the coating material to have excellent friction characteristics by forming a tribofilm of VON on a coating layer.

Further, C together with V serves to enhance sticking resistance, oxidation resistance, wear resistance, low friction and the like of the coating material. According to various embodiments, the content of V is preferably about 5 atom % to about 30 atom % (atomic percent), and the content of C is preferably about 5 atom % to about 20 at %. In this case, the content of VC is preferably about 10 atom % to about 50 atom %. If the content of VC is less than 10 atom %, low friction, sticking resistance and the like of the coating material may deteriorate. On the other hand, if the content of VC is more than 50 atom %, thermal resistance, hardness and the like of the coating material may deteriorate.

In addition, the content of CrSi is preferably about 5 atom % to about 40 atom %. If the content of CrSi is less than 5 atom %, toughness, sticking resistance and the like of the coating material may deteriorate. On the other hand, if the content of CrSi is more than 40 atom %, hardness, thermal resistance and the like of the coating material may deteriorate because the contents of the other elements are relatively decreased.

According to various embodiments, the thickness of the TiAl(CrSi)VCN functional layer is preferably about 0.5 μm to about 10 μm. If the thickness of the TiAl(CrSi)VCN functional layer is less than 0.5 μm, it is difficult to enhance oxidation resistance, thermal resistance, wear resistance, sticking resistance, low friction and the like of the coating material. On the other hand, if the thickness of the TiAl(CrSi)VCN functional layer is more than 10 μm, the role of the functional layer is saturated and the economy thereof may deteriorate (i.e., further increase in the amount of the TiAlN/CrN through an increased thickness in the layer does not provide further benefits or adequate benefits to justify the additional cost associated therewith).

2. Use

It is preferred that the coating material according to the present invention is applied to a mold in order to enhance oxidation resistance, wear resistance, sticking resistance, low friction, toughness and the like of the mold. According to preferred embodiments, the coating material is applied particularly to a hot stamping mold or the surface of an aluminum die casting mold, which are exposed to high temperatures.

According to preferred embodiments, the coating material of the present invention is applied to the surface of metals or parts which are exposed to high temperature conditions. More preferably, the coating material is applied to the surface of a high-temperature sliding member of an engine or an exhaust system, an exhaust valve face member, and/or a washer in an EGR or a turbocharger high-temperature sliding member.

3. Coating Method

Hereinafter, another aspect of the present invention relating to a method for coating a coating material for use in an aluminum die casting process will be described in further detail.

It is preferred that as a method for applying the coating material of the present invention, a physical vapor deposition (PVD) method, a chemical vapor deposition (CVD) method and the like are generally used. According to particularly preferred embodiments, a physical vapor deposition method is used.

The PVD method is generally a dry processing method in which a negative polarity is applied to a target base material (material) and an ionized metal material is supplied in a vapor state, thereby resulting in deposition of the ionized metal material on the surface or a base material by electrical attraction force. In particular, the PVD method uses fine ion particles and, thus, is advantageous in that the surface of the base material may be uniformly coated and adhesion of the coating may be enhanced. In addition, it is preferred that arc, high power impulse magnetron sputtering (HIPIMS), inductive coupled plasma (ICP) and the like are used in the PVD method in order to make particles of the coating material nano-sized and implement a high-speed coating.

Figure 2:
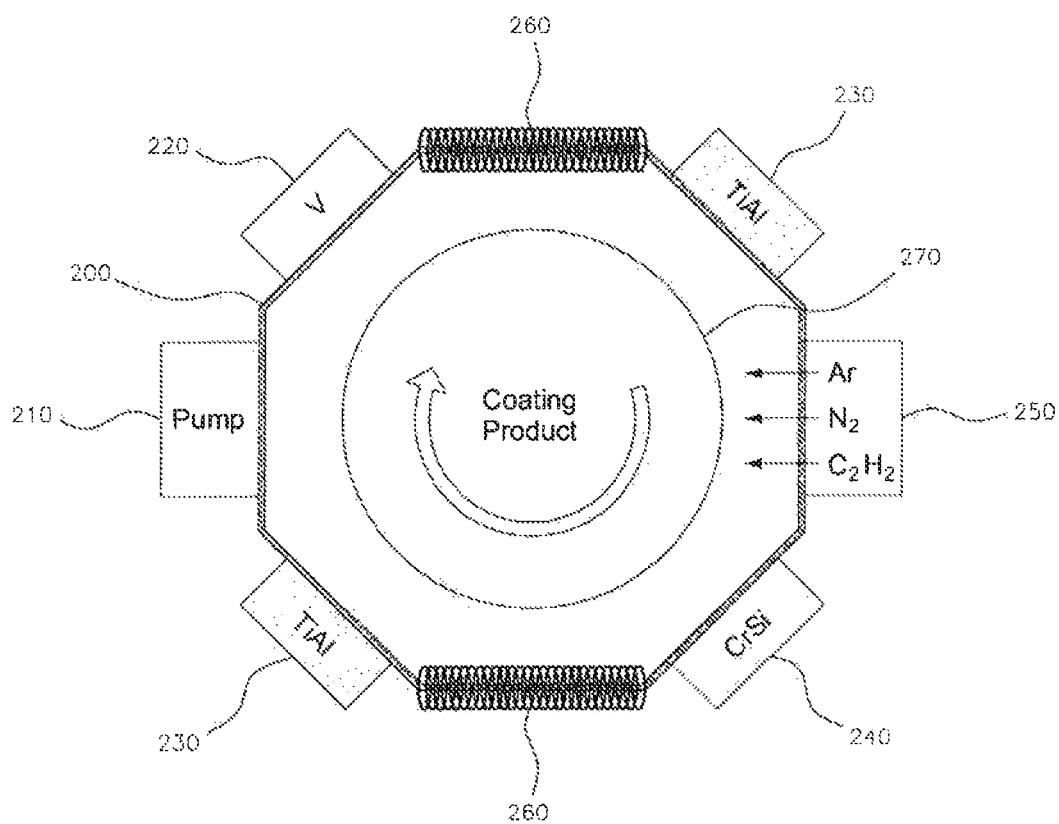
FIG. 2 is a view illustrating a PVD (physical vapor deposition) apparatus for coating the coating material according to an embodiment of the present invention.

FIG. 2 is a view illustrating a PVD (physical vapor deposition) apparatus for coating the coating material according to an embodiment of the present invention. As illustrated in FIG. 2, the PVD apparatus includes: a chamber 200; a pump 210, a V target 220, a TiAl target 230, a Cr/Si target 240, a gas introducing unit 250, and a heating unit 260 that are provided in the chamber 200; and a mold base material (substrate) mounted on a rotating holder 270 in the chamber 200. According to various embodiments, a mold base material having as surface which is subjected to a nitriding treatment may be used.

According to a preferred embodiment, the method for coating a coating material for aluminum die casting including the TiAlCrSiVCN functional layer 130 includes: a first step of forming a nitrogen atmosphere by introducing a nitrogen gas into a chamber 200 in which a base material 100 is disposed through the gas introducing unit 250, and then depositing the CrN adhesion layer 110 on the surface of the base material 100 by using the Cr/Si target 240; a second step of depositing the TiAlN/CrN support layer 120 on the surface of the deposited CrN adhesion layer 110 by using the TiAl target 230 and the Cr/Si target 240; a third step of forming an acetylene gas ($C_2H_2$) atmosphere by introducing an acetylene gas ($C_2H_2$) through the gas introducing unit 250, and then depositing the TiAlOrSiVCN functional layer 130 on the surface of the deposited TiAlN/CrN support layer 120 by using the TiAl target 230, the Cr/Si target 240 and the V target 220; and the like, thereby forming the coating.

According to various embodiments, the method for coating a coating material for aluminum die casting includes: a first step of forming a nitrogen atmosphere by introducing a nitrogen gas into a chamber 200 housing a base material 100 through the gas introducing unit 250, and then depositing the CrN adhesion layer 110 on the surface of the base material 100 by using the Cr/Si target 240; a second step of depositing the TiAlN/CrN support layer 120 on the surface of the deposited CrN adhesion layer 110 by using the TiAl target 230 and the Cr/Si target 240; a third step of forming an acetylene gas ($C_2H_2$) atmosphere by introducing an acetylene gas ($C_2H_2$) through the gas introducing unit 250, and then depositing the TiAlVCN functional layer 130 on the surface of the deposited TiAlN/CrN support layer 120 by using the TiAl target 230 and the V target 220; and the like, thereby forming the coating.

According to preferred embodiments, as a pre-treatment step for the coating, the inside of the chamber 200 is evacuated using the pump 210 to maintain the inside in a vacuum state, and then a plasma state of argon is created by introducing an argon gas through the gas introducing unit 250.

Further, the surface of the base material may be cleaned while the chamber 200 is heated (e.g. using the heating unit 260) up to the coating temperature, and may be activated by applying a bias voltage to the base material 100 to allow argon positive ions to collide with the surface of the mold.

Subsequently, a nitrogen ($N_2$) atmosphere is formed by introducing a nitrogen gas ($N_2$) into the chamber 200 through the gas introducing unit 250, and then the CrN adhesion layer 110 is preferably deposited to have thickness from about 0.1 μm to about 10 μm by supplying the surface of the base material 100 with Cr ions by means of the Cr/Si target 240.

Thereafter, the TiAlN/CrN support layer 120 is formed, preferably wherein the TiAlN/CrN support layer 120 has a multilayer structure in which the TiAlN layer and the CrN layer are alternately laminated on the surface of the CrN adhesion layer 110. Preferably, the TiAlN/CrN support layer 120 is deposited to have a thickness from about 0.5 μm to about 10 μm by selectively exposing the base material, on which the CrN adhesion layer 110 is deposited, to the TiAl target 230 that supplies Ti and Al ions and the Cr/Si target 240 that supplies Cr ions by means of the rotation holder 270.

In this case, the TiAlN/CrN support layer 120 is a support layer which enhances thermal resistance, oxidation resistance, wear resistance, and toughness of the base material 100. According to preferred embodiments, the TiAlN/CrN support layer 120 is deposited at the ratio of Ti:Al:Cr of preferably about 1:1:1 in consideration of the alternate lamination of each layer for maximizing the desired effects.

Thereafter, in order to provide the TiAlCrSiVCN functional layer 130, an acetylene gas ($C_2H_2$) atmosphere is formed by introducing an acetylene gas ($C_2H_2$) into the chamber 200 through the gas introducing unit 250, and then the TiAlCrSiVCN functional layer 130 is deposited to have a thickness preferably from about 0.5 μm to about 10 μm on the surface of the formed TiAlN/CrN support layer 120 by selectively exposing the base material, on which the TiAlN/CrN support layer 120 is deposited, to the TiAl target 230 that supplies Ti and Al ions, the Cr/Si target 240 that supplies Cr and/or Si ions, and the V target 220 that supplies V ions.

In this case, it is preferred that the V content, the C content and the VC content of the TiAlCrSiVCN functional layer 130 are about 5 atom % to about 30 atom %, about 5 atom % to about 20 atom %, and about 10 atom % to about 50 atom %, respectively. Further, a CrSi content thereof is preferably about 5% to about 40 atom % when CrSi is added.

Alternatively, in order to include the TiAlVCN functional layer 130, an acetylene gas ($C_2H_2$) atmosphere is formed by introducing an acetylene gas ($C_2H_2$) into the chamber 200 through the gas introducing unit 250, and then the TiAlVCN functional layer 130 is deposited to have a thickness preferably from about 0.5 μm to about 10 μm on the surface of the formed TiAlN/CrN support layer 120 by selectively exposing the base material, on which the TiAlN/CrN support layer 120 is deposited, to the TiAl target 230 that supplies Ti and Al ions and the V target 220 that supplies V ions.

In this case, it is preferred that the V content, the C content and the VC content of the TiAlVCN functional layer 130 are about 5 atom % to about 30 atom %, about 5 atom % to about 20 atom %, and about 10 atom % to about 50 atom %, respectively.

EXAMPLE

Hereinafter, the present invention will be described in more detail through the Examples. These Examples are only for illustrating the present invention, and it will be obvious to those skilled in the art that the scope of the present invention is not interpreted to be limited by these Examples.

In order to compare physical properties of the coating material for aluminum die casting according to the present invention, coating materials of Example 1 (in accordance with the present invention) and Comparative Examples 1 and 2 (not in accordance with the present invention) were coated on a base material using a PVD method, and then physical properties of the coating materials of Example 1 and Comparative Examples 1 and 2 were compared with one other.

TABLE 1

| Classification | Comparative Example 1 | Comparative Example 2 | Example 1 |
| --- | --- | --- | --- |
| Coating | TiAlN | TiAlCN | TiAlVCN |
| Processing method | PVD | PVD | PVD |
| Coating thickness (μm) | 10.2 (4.9 CrN-5.3 TiAlN) | 10.3 (4 CrN-4.1 TiAlCrN-2.2 TiAlCN) | 10.2 (3.9 CrN-4.1 TiAlCrN-2.2 TiAlVCN) |
| Coating adhesion force (N) | 50 or more | 50 or more | 50 or more |
| Hardness (HV) | 2925 | 2903 | 2805 |
| After being left to stand at 750° C. for 6 hoursHardness (HV) | 2234 | 2654 | 2805 |
| Ratio of hardness reduction (%) | 23.6 | 8.5 | 1.6 |

Table 1 is a table that compares and summarizes coating adhesion force, hardness, and hardness after being left to stand at a high temperature using the coating materials of Example 1 and Comparative Examples 1 and 2. The Example and Comparative Examples had different constitutions in each of the coating materials, but had almost the same total thickness of coating layer.

It was confirmed that both the Example and Comparative Examples had a coating adhesion force of 50 or more, which is a sufficient adhesion force. In the case of hardness, the Comparative Examples seemed to be slightly better than the Example. However, in the case of hardness obtained after a sample was left to stand at 750° C. for 6 hours, a value of 2805 HV was measured in Example 1, which was much better than a value of 2234 HV in Comparative Example 1 and a value of 2654 HV in Comparative Example 2.

In particular, in terms of a reduction ratio of hardness after being left to stand at a high temperature, the value in Example 1 was 1.6%, which was hardly changed, whereas Comparative Example 1 and 2 showed reduction ratios of 23.6% and 8.5%, which correlate to large reductions of hardness. Therefore, it was demonstrated that Example 1 was better than Comparative Examples 1 and 2 by about 15 times to about 5 times, respectively, in terms of thermal resistance, high-temperature stability and the like.

TABLE 2

| Classification | Comparative Example 1 | Comparative Example 2 | Example 1 |
| --- | --- | --- | --- |
| Coating | TiAlN | TiAlCN | TiAlVCN |
| Wear amount (mg) of coating material (disc) | 18.4 | 9.2 | 1.16 |
| Wear amount (mg) of counterpart material (pin) | 66.2 | 28.1 | 7.1 |
| Coefficient of friction | 0.81 | 0.59 | 0.35 |

Table 2 is a table which compares the wear amounts and coefficients of friction between the coating material and super light pin (WC) according to the coating material using a high-temperature pin on disc fraction and wear tester. The test was conducted at test conditions in which a perturbation distance of 2,000 m, a load of 20 N, a rate of 0.1 m/s and 750° C. were used, and as a result of the test, it was determined that Example 1 had excellent friction characteristics. This was determined through the fact that the Example was much smaller than the Comparative Examples in not only the wear amount but also the coefficient of friction of the coating material and the counterpart material.

Figure 3:
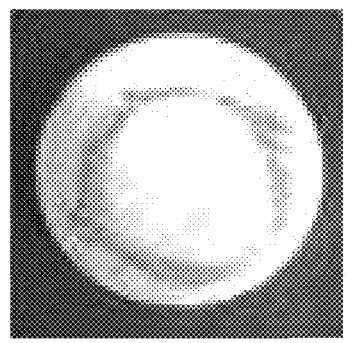
FIG. 3 is a photo of a coating material of Comparative Example 1 after a friction and abrasion test.
Figure 4:
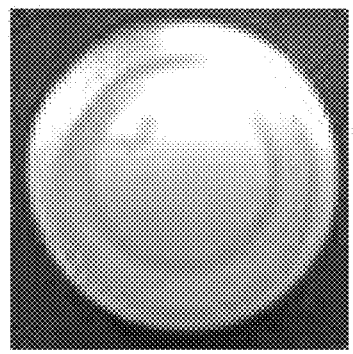
FIG. 4 is a photo of a coating material of Comparative Example 2 after a friction and abrasion test.
Figure 5:
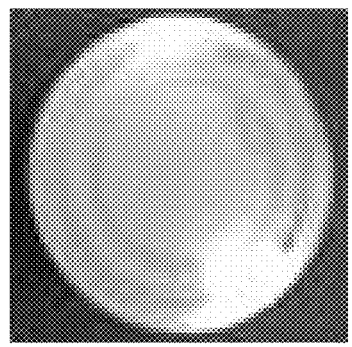
FIG. 5 is a photo of a coating material of Example 1 after a friction and abrasion test.

Further, FIG. 3 is a photo of the coating material of Comparative Example 1 after the friction and wear test, FIG. 4 is a photo of the coating material of Comparative Example 2 after the friction and wear test, and FIG. 5 is a photo of the coating material of Example 1 after the friction and wear test. As can be seen through the drawings, it was confirmed that the surface of the coating material of Example 1 in FIG. 5 is cleaner than those of Comparative Examples 1 and 2 in FIGS. 3 and 4, and that wear occurs less in Example 1 than in Comparative Examples 1 and 2.

TABLE 3

| Classification | Comparative Example 1 | Comparative Example 2 | Example 1 |
| --- | --- | --- | --- |
| Coating material | TiAlN | TiAlCN | TiAlVCN |
| Test result | Insufficient thermal resistance and partially molten | Large surface defect | Small surface defect |

Table 3 is a table which compares the results of the dipping and rotating test conducted in order to compare thermal resistances of the Example and Comparative Examples. The dipping and rotating test was conducted by dipping and rotating the samples in the Example and Comparative Examples at 750° C. in an aluminum melt liquid for up to 30 hours, washing the samples with sodium hydroxide (NaOH), and then confirming whether there were surface defects in the Example and Comparative Examples.

Figure 6:
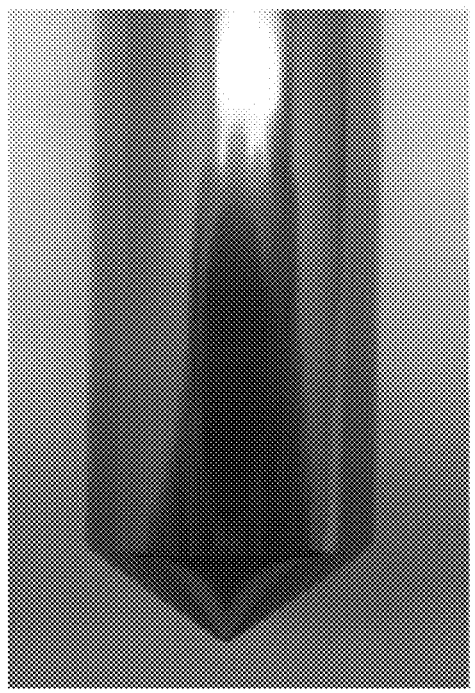
FIG. 6 is a photo of Comparative Example 1 before a dipping and rotating test.
Figure 7:
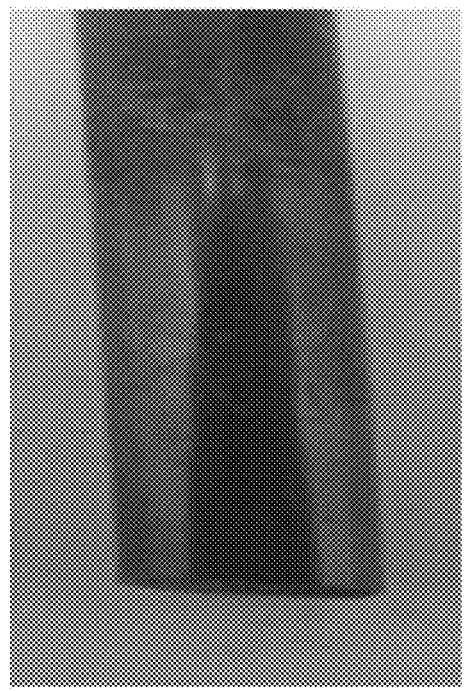
FIG. 7 is a photo of Comparative Example 1 after a dipping and rotating test.

FIG. 6 is a photo of Comparative Example 1 before the dipping and rotating test and FIG. 7 is a photo of Comparative Example 1 after the dipping and rotating test. As shown in the drawings, Comparative Example 1 had insufficient thermal resistance and a part of the sample was molten after the test.

Figure 8:
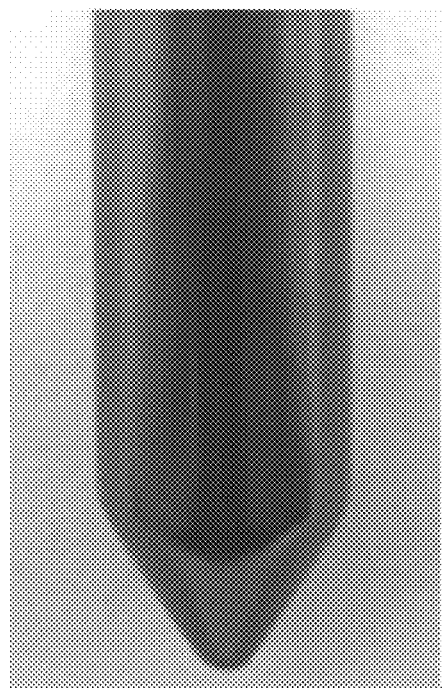
FIG. 8 is a photo of Comparative Example 2 before a dipping and rotating test.
Figure 9:
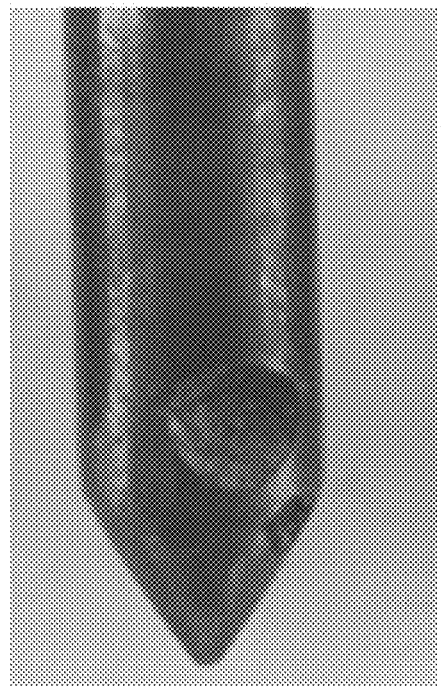
FIG. 9 is a photo of Comparative Example 2 after a dipping and rotating test.

Further, FIG. 8 is a photo of Comparative Example 2 before the dipping and rotating test, and FIG. 9 is a photo of Comparative Example 2 after the dipping and rotating test. As shown in the drawings, Comparative Example 2 also had insufficient thermal resistance and a large defect was generated on the surface.

Figure 10:
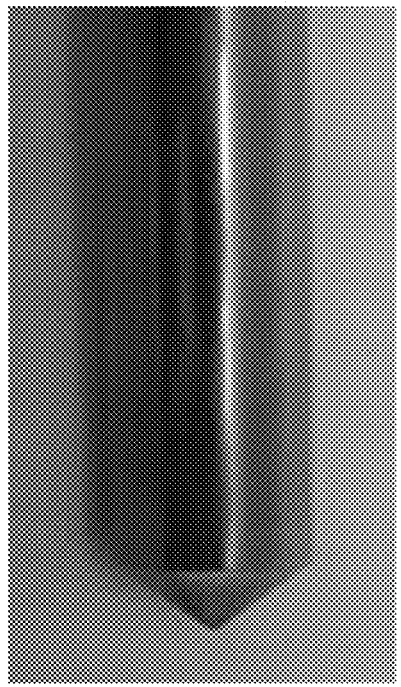
FIG. 10 is a photo of Example 1 before a dipping and rotating test.
Figure 11:
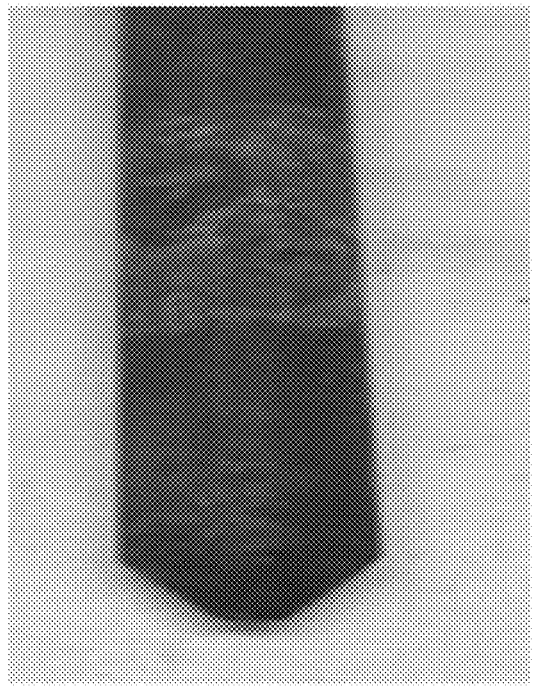
FIG. 11 is a photo of Example 1 after a dipping and rotating test.

On the contrary, FIG. 10 is a photo of Example before the dipping and rotating test, and FIG. 11 is a photo of Example 1 after the dipping and rotating test. As shown in the drawings, Example 1 had better thermal resistance than that in the Comparative Examples and defect was rarely generated on the surface.

Therefore, it was demonstrated that Example 1 according to the present invention had better thermal resistance than Comparative Examples 1 and 2 which were conventional coating materials, and in the dipping and rotating test, surface defects were generated less in Example 1 than in Comparative Examples 1 and 2.

TABLE 4

| | Classification | Comparative Example 1 | Comparative Example 2 | Example 1 |
|---|---|---|---|---|
| | Coating | TiAlN | TiAlCN | TiAlVCN |
| Thermal impact | Change in color (visual) | Yes | Yes | None |
| | Crack | Yes | Yes | None |
| | Hardness (HV) before thermal impact | 2925 | 2903 | 2850 |
| | Hardness (HV) after thermal impact | 2634 | 2497 | 2736 |
| | Variation (%) in hardness | 9 | 14 | 4 |

Table 4 is a table which compares the results of the thermal impact resistance test conducted in the Example and Comparative Examples. The test was conducted by heating the samples in the Example and Comparative Examples one time at 800° C. for 2 minutes and slowly cooling the samples to normal temperature (i.e., room temperature) and then repeating three times heating the samples at 800° C. for 2.5 minutes and then water-cooling the samples.

As a result of the test, a change in color and cracks were generated in Comparative Examples 1 and 2 after the thermal impact test. On the other hand, no change in color and no cracks were generated in Example 1. In addition, reduction in hardness was generated by about 9% to about 14% in Comparative Examples 1 and 2, whereas reduction in hardness was generated by only about 4% in Example 1.

Figure 12:
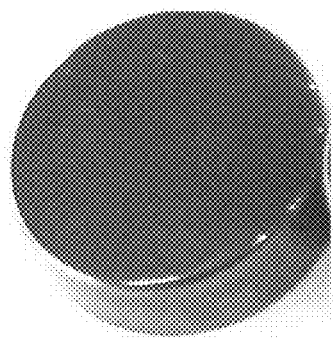
FIG. 12 is a photo of Comparative Example 1 before a thermal impact test.
Figure 13:
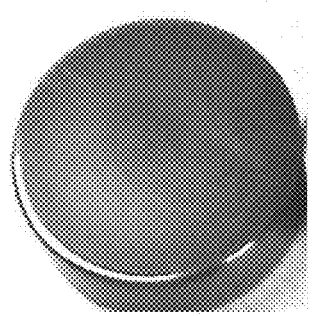
FIG. 13 is a photo of Comparative Example 1 after a thermal impact test.

FIG. 12 is a photo of Comparative Example 1 before the thermal impart test, and FIG. 13 is a photo of Comparative Example 1 after the thermal impact test. As shown in the drawings, the surface color of Comparative Example 1 was changed as a result of the test.

Figure 14:
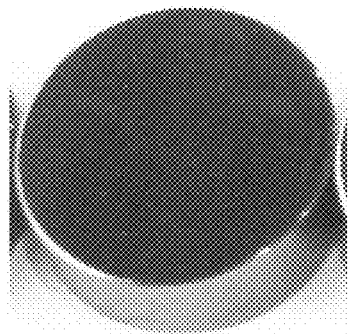
FIG. 14 is a photo of Comparative Example 2 before a thermal impact test.
Figure 15:
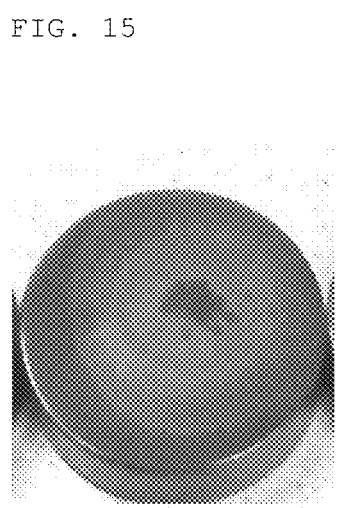
FIG. 15 is a photo of Comparative Example 2 after a thermal impact test.

Furthermore, FIG. 14 is a photo of Comparative Example 2 before the thermal impact test, and FIG. 15 is a photo of Comparative Example 2 after the thermal impact test. As shown in the drawings, the surface color of Comparative Example 2 was also changed as a result of the test.

Figure 16:
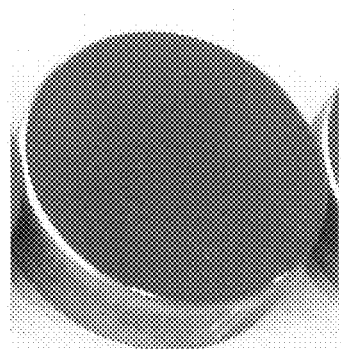
FIG. 16 is a photo of Example 1 before a thermal impact test.
Figure 17:
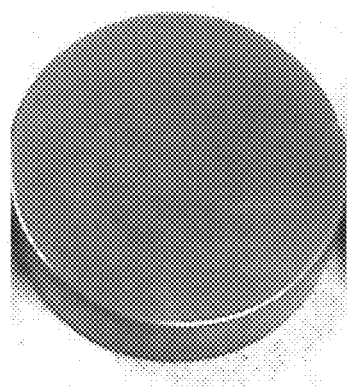
FIG. 17 is a photo of Example 1 after a thermal impact test.

On the contrary, FIG. 16 is a photo of Example 1 before the thermal impact test, and FIG. 17 is a photo of Example 1 after the thermal impact test. Unlike Comparative Examples 1 and 2, it was demonstrated that the surface color of Example 1 was barely changed as a result of the test.

Therefore, was confirmed that Example 1 according to the present invention was superior in thermal impact resistance by about 2 times or more than Comparative Example 1 or 2 in the related art.

As described above, the present invention has been described in relation to specific embodiments of the present invention, but this is only illustration and the present invention is not limited thereto. The embodiments described may be changed or modified by those skilled in the art to which the present invention pertains without departing from the scope of the present invention, and various alterations and modifications are possible within the technical spirit of the present invention and the equivalent scope of the claims which will be described below.

What is claimed is:

1. A coating material for application on an aluminum die casting base material, comprising:
   a CrN adhesion layer coated on a surface of the base material;
   a TiAlN/CrN support layer coated on a surface of the CrN adhesion layer; and
   a TiAl(CrSi)VCN functional layer coated on a surface of the TiAlN/CrN support layer;
   wherein a VC content of the TiAl(CrSi)VCN functional layer is about 10 atom % to about 50 atom %,
   wherein a CrSi content of the TiAl(CrSi)VCN functional layer is about 5 atom % to about 40 atom %.

2. The coating material of claim 1, wherein a thickness of the TiAl(CrSi)VCN functional layer is about 0.5 μm to about 10 μm.

3. The coating material of claim 1, wherein a thickness of the TiAlN/CrN support layer is about 0.5 μm to about 10 μm and a thickness of the CrN adhesion layer is about 0.1 μm to about 10 μm.

* * * * *